(12) United States Patent
Jung et al.

(10) Patent No.: US 10,714,705 B2
(45) Date of Patent: Jul. 14, 2020

(54) ORGANIC LIGHT EMITTING DISPLAY DEVICE

(71) Applicant: Samsung Display Co., Ltd., Yongin-Si, Gyeonggi-Do (KR)

(72) Inventors: Haegoo Jung, Seongnam-si (KR); Hwan Woo Lee, Hwaseong-si (KR); Yeon-Shil Jung, Cheonan-si (KR); Boock Jang, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/687,575

(22) Filed: Nov. 18, 2019

(65) Prior Publication Data

US 2020/0176707 A1 Jun. 4, 2020

(30) Foreign Application Priority Data

Nov. 29, 2018 (KR) .................. 10-2018-0150437

(51) Int. Cl.
*H01L 29/08* (2006.01)
*H01L 51/52* (2006.01)
*H01L 27/32* (2006.01)

(52) U.S. Cl.
CPC ...... *H01L 51/5246* (2013.01); *H01L 27/3262* (2013.01); *H01L 27/3276* (2013.01)

(58) Field of Classification Search
CPC . H01L 51/52; H01L 51/5246; H01L 27/3262; H01L 27/3276
See application file for complete search history.

(56) References Cited

U.S. PATENT DOCUMENTS

| 2003/0184704 | A1* | 10/2003 | Akiyama | .......... G02F 1/133305 349/158 |
| 2015/0090982 | A1* | 4/2015 | Lin | .......... H01L 51/525 257/40 |
| 2016/0152875 | A1* | 6/2016 | No | .......... C09J 133/08 359/893 |
| 2017/0005280 | A1* | 1/2017 | Lee | .......... H01L 51/0097 |
| 2018/0039362 | A1 | 2/2018 | Liu et al. | |

FOREIGN PATENT DOCUMENTS

| KR | 10-2015-0112885 A | 10/2015 |
| KR | 10-1565183 B1 | 11/2015 |
| KR | 10-2018-0036882 A | 4/2018 |

* cited by examiner

*Primary Examiner* — Phuc T Dang
(74) *Attorney, Agent, or Firm* — Innovation Counsel LLP

(57) ABSTRACT

A display device may include a first substrate, a second substrate, a light emitting structure, a seal member, a seal structure, a pad electrode, and a connection wire. The second substrate may overlap the first substrate. The light emitting structure may be positioned between the first substrate and the second substrate. The seal member may be positioned between the first substrate and the second substrate. The seal structure may be spaced from the seal member. A section of the seal member may be positioned between the light emitting structure and the seal structure. The seal structure may be positioned between the seal member and the pad electrode. The connection wire may electrically connect the seal structure and the pad electrode.

20 Claims, 11 Drawing Sheets

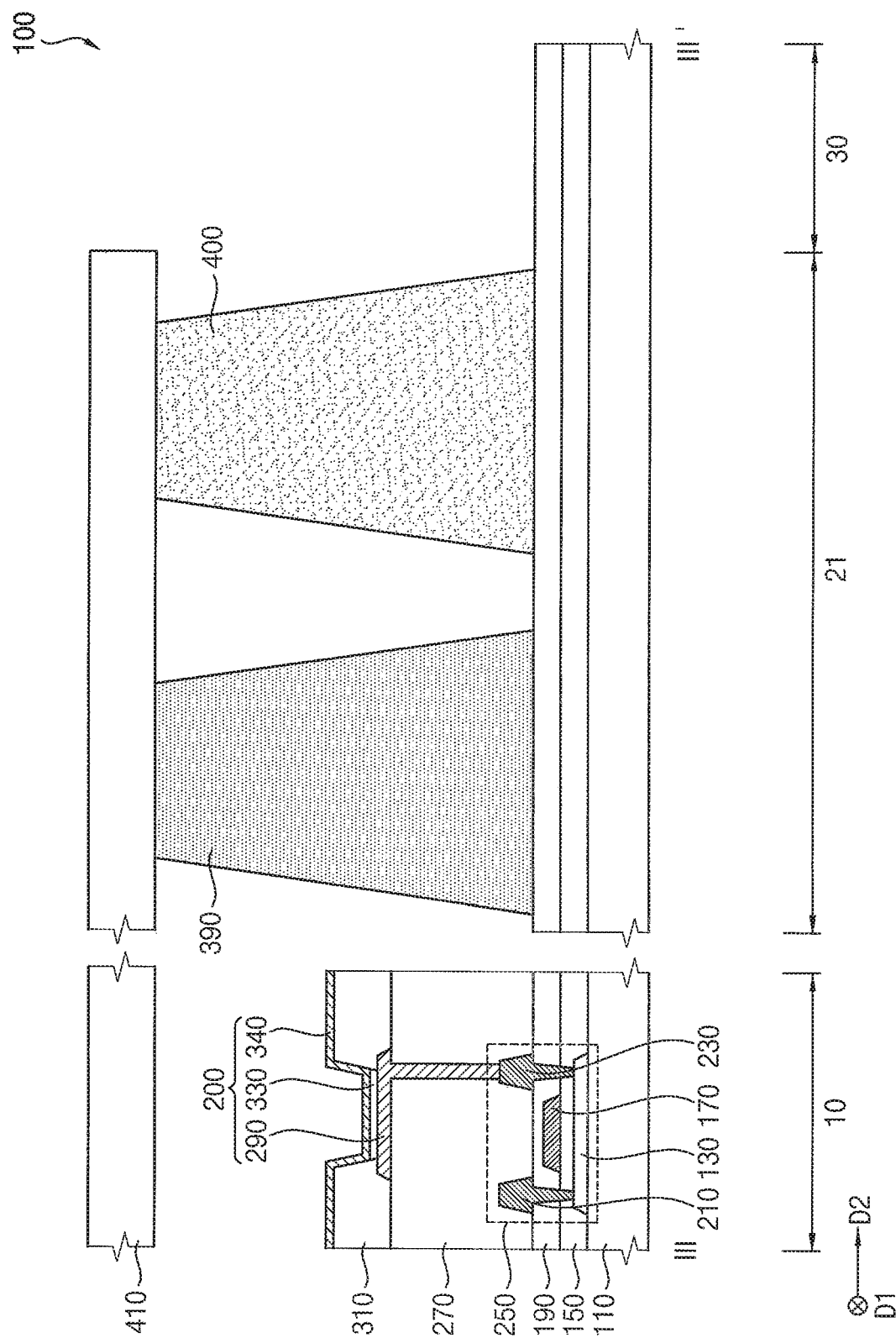

ORGANIC LIGHT EMITTING DISPLAY DEVICE

CROSS-REFERENCE TO RELATED APPLICATION(S)

This application claims priority under 35 USC § 119 to Korean Patent Application No. 10-2018-0150437, filed on Nov. 29, 2018 in the Korean Intellectual Property Office (KIPO); the contents of the Korean Patent Application are incorporated herein by reference.

BACKGROUND

1. Field

The technical field relates to a display device. More particularly, the technical field relates to an organic light emitting display device.

2. Description of the Related Art

An organic light emitting display (OLED) device may include an upper substrate, a lower substrate, a plurality of light emitting structures disposed between the substrates, and a seal member surrounding the light emitting structures and bonding the substrates. If the seal member becomes detached from the upper substrate or the lower substrate, the light emitting structures may not be sufficiently protected. As a result, the durability and/or performance of the OLED device may be unsatisfactory.

SUMMARY

Some example embodiments may be related to an organic light emitting display (OLED) device including a seal member.

According to some example embodiments, an OLED device includes a lower substrate, a plurality of light emitting structures, an upper substrate, a seal member, a seal pattern, a pad electrode, and a connection wiring. The lower substrate has a display region, a peripheral region surrounding the display region, and a pad region that is located in one side of the peripheral region. The light emitting structures are disposed in the display region on the lower substrate. The upper substrate is disposed in the display region and peripheral region on the light emitting structures. The seal member is disposed in the peripheral region between the lower substrate and the upper substrate. The seal pattern is spaced apart from the seal member in the peripheral region. The pad electrode is disposed in the peripheral region on the lower substrate. The connection wiring electrically connects the seal pattern and the pad electrode.

In example embodiments, the peripheral region may include a first peripheral region located adjacent to the pad region and a second peripheral region that is different from the first peripheral region.

In example embodiments, the seal pattern may be disposed in the first peripheral region.

In example embodiments, the seal pattern in the first peripheral region may extend in a first direction, and may be spaced apart from the seal member in a second direction that is perpendicular to the first direction.

In example embodiments, the seal pattern may include a first seal pattern disposed in one side of the first peripheral region and a second seal pattern disposed in another side of the first peripheral region.

In example embodiments, the OLED device may further include a connection electrode disposed between the first seal pattern and the second seal pattern. The connection electrode may extend in the first direction, and may electrically connect the first seal pattern and the second seal pattern.

In example embodiments, the seal pattern may include first through (N)th seal patterns, where N is an integer more than 1, and the first through (N)th seal patterns may be spaced apart from each other.

In example embodiments, the OLED device may further include a plurality of connection electrodes disposed in spaces where the first through (N)th seal patterns are spaced apart from each other, respectively. The connection electrodes may electrically connect the first through (N)th seal patterns.

In example embodiments, the connection electrodes may include an upper connection electrode disposed between (K)th and (K+1)th seal patterns among the first through (N)th seal patterns and a lower connection electrode disposed between (K+1)th and (K+2)th seal patterns among the first through (N)th seal patterns, where K is an integer between 1 and N.

In example embodiments, the upper connection electrode may be disposed on a lower surface of the upper substrate, and the lower connection electrode may be disposed on the lower substrate.

In example embodiments, a width of the first peripheral region may be greater than a width of the second peripheral region.

In example embodiments, the lower substrate may have a reduced width in the pad region.

In example embodiments, the upper substrate may expose the lower substrate located in the pad region.

In example embodiments, the seal pattern may include conductive materials.

In example embodiments, the connection wiring may include a first connection wiring coupled to a first side portion of the seal pattern and a second connection wiring coupled to a second side portion, which is opposite to the first side portion, of the seal pattern. The pad electrode may include a first pad electrode coupled to the first connection wiring and a second pad electrode coupled to the second connection wiring.

In example embodiments, an external device may be electrically connected to the first and second pad electrodes, and may measure a resistance value between first and second pad electrodes.

In example embodiments, the seal member may have a plan shape of a hollow rectangular, and the seal pattern may have a plan shape of a bar.

In example embodiments, the OLED device may further include a plurality of semiconductor elements disposed in the display region on the lower substrate. Each of the semiconductor elements may include an active layer disposed on the lower substrate, a gate insulation layer disposed on the active layer, a gate electrode disposed on the gate insulation layer, an insulation interlayer disposed on the gate electrode, and source and drain electrodes disposed on the insulation interlayer.

In example embodiments, the gate insulation layer and the insulating interlayer may be disposed between the seal member and the lower substrate.

In example embodiments, each of the light emitting structures may include a lower electrode disposed on the lower substrate, a light emitting layers disposed on the lower electrode, and an upper electrode disposed on the light emitting layer.

An embodiment may be related to a display device, such as an OLED device. The display device may include a first substrate, a second substrate, a light emitting structure, a seal member, a seal structure, a first pad electrode, and a first connection wire. The second substrate may overlap the first substrate. The light emitting structure may be positioned between the first substrate and the second substrate. The seal member may be positioned between the first substrate and the second substrate. The seal structure may be spaced from the seal member. A first section of the seal member may be positioned between the light emitting structure and the seal structure. The seal structure may be positioned between the seal member and the first pad electrode. The first connection wire may electrically connect the seal structure and the first pad electrode.

The first section of the seal member may be directly connected to a second section of the seal member and may be positioned between the second section of the seal member and the seal structure. A lengthwise direction of the first section of the seal member may be different from a lengthwise direction of the second section of the seal member.

The seal structure may be shorter than the first section of the seal member in a lengthwise direction of the first section of the seal member.

The seal structure may be spaced from the seal member in a direction that is perpendicular to a lengthwise direction of the first section of the seal member.

The seal structure may include a first seal part and a second seal part. The first seal part may correspond to a first end of the first section of the seal member. The second seal part may be spaced from the first seal part and may correspond to a second end of the first section of the seal member.

The display device may include a connection electrode disposed between the first seal part and the second seal part, extending parallel to the first section of the seal member, and electrically connecting the first seal part and the second seal part.

The seal structure may include seal parts that are spaced from each other.

The display device may include first-set connection electrodes disposed between first-set immediately neighboring ones of the seal parts and electrically connecting the first-set immediately neighboring ones of the seal parts.

The display device may include second-set connection electrodes disposed closer to the first substrate than the first-set connection electrodes, disposed between second-set immediately neighboring ones of the seal parts, and electrically connecting the second-set immediately neighboring ones of the seal parts.

The first-set connection electrodes may be disposed directly on the second substrate. The second-set connection electrodes may be disposed directly on the first substrate.

The first-set connection electrodes and the second-set connection electrodes may be alternately arranged along a lengthwise direction of the first section of the seal member.

A sum of a width of the first section of the seal member and a width of the seal structure in a width direction of the first section of the seal member may be greater than a width of a second section of the seal member in a direction perpendicular to the width direction of the first section of the seal member.

The first pad electrode may be positioned closer to a first edge of the first substrate than to a second edge of the first substrate. The first edge of the first substrate may be parallel to the second edge of the first substrate and may be shorter than the second edge of the first substrate.

An edge of the second substrate may be positioned between the seal structure and the first pad electrode.

The seal structure may include at least one conductive material.

The display device may include a second pad electrode and a second connection wire. The seal structure may be positioned between the seal member and the second pad electrode. The second connection wire may electrically connect the seal structure and the second pad electrode. The first connection wire and the second connection wire may be respectively directly connected to two opposite ends of the seal structure.

A length of the seal structure may be greater than a distance between first pad electrode and the second pad electrode.

The seal member may surround the light emitting structure in a plan view of the display device. The seal structure has a bar shape in the plan view of the display device.

Each of the seal member and the seal structure may directly contact the second substrate.

The display device may include the following elements: a semiconductor layer overlapping the first substrate; a gate electrode overlapping the semiconductor layer; a gate insulation layer electrically insulating the gate electrode from the semiconductor layer; a drain electrode electrically connected to the semiconductor layer and electrically connected to the light emitting structure; and an insulating interlayer electrically insulating the drain electrode from the gate electrode. The gate insulation layer and the insulating interlayer may be disposed between the seal member and the first substrate.

The gate insulation layer and the insulating interlayer may be disposed between the seal structure and the first substrate.

In accordance with example, an OLED device may be checked to determine whether a seal member is defective based on a resistance value between a first pad electrode and a second pad electrode. Detected defective seal members may be repaired.

Advantageously, defective OLED devices may be minimized.

In embodiments, a seal structure/pattern may provide an adhesive force between substrates. Advantageously, delamination the substrates may be substantially prevented, and satisfactory quality of the associated OLED device may be attained.

BRIEF DESCRIPTION OF THE DRAWINGS

FIG. 7A is a cross-sectional view taken along a line III-III' of FIG. 2 in accordance with embodiments.

DETAILED DESCRIPTION OF EMBODIMENTS

Example embodiments are described with reference to the accompanying drawings. Although the terms "first," "second," etc. may be used herein to describe various elements, these elements, should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively. The term "connect" may mean "electrically connect." The term "conductive" may mean "electrically conductive." The term "insulate" may mean "electrically insulate." The term "pattern" may mean "structure," "member," or "set." The term "semiconductor element" may mean "transistor." The term "active layer" may mean "semiconductor layer." The term "surface" may mean "face." A noun may mean a noun set; for example, an "electrode" may mean an "electrode set"; a "wire" may mean a "wire set." The term "side portion" may mean "end portion."

Figure 1:
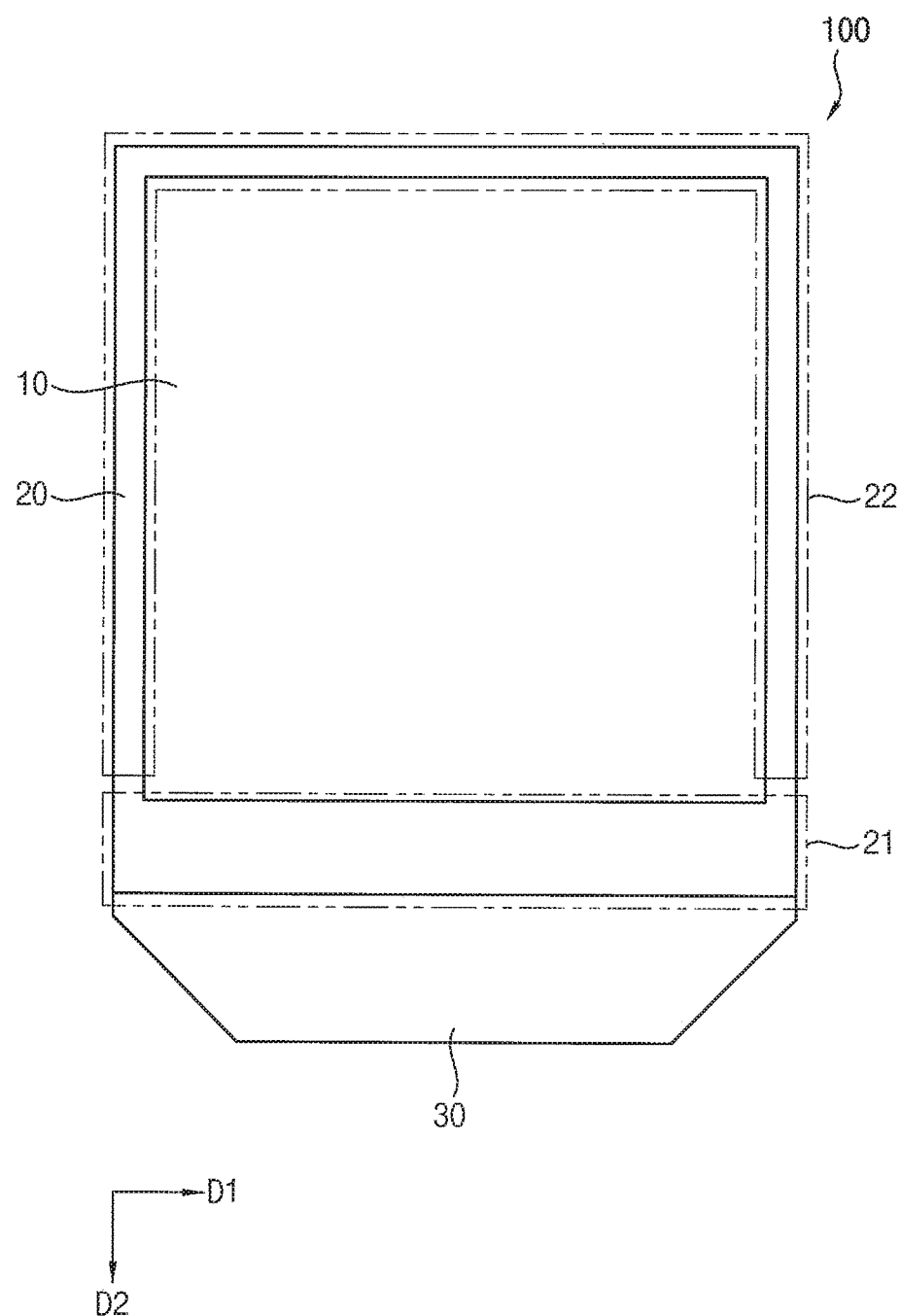
FIG. 1 is a plan view illustrating elements of an organic light emitting display (OLED) device in accordance with embodiments.
Figure 2:
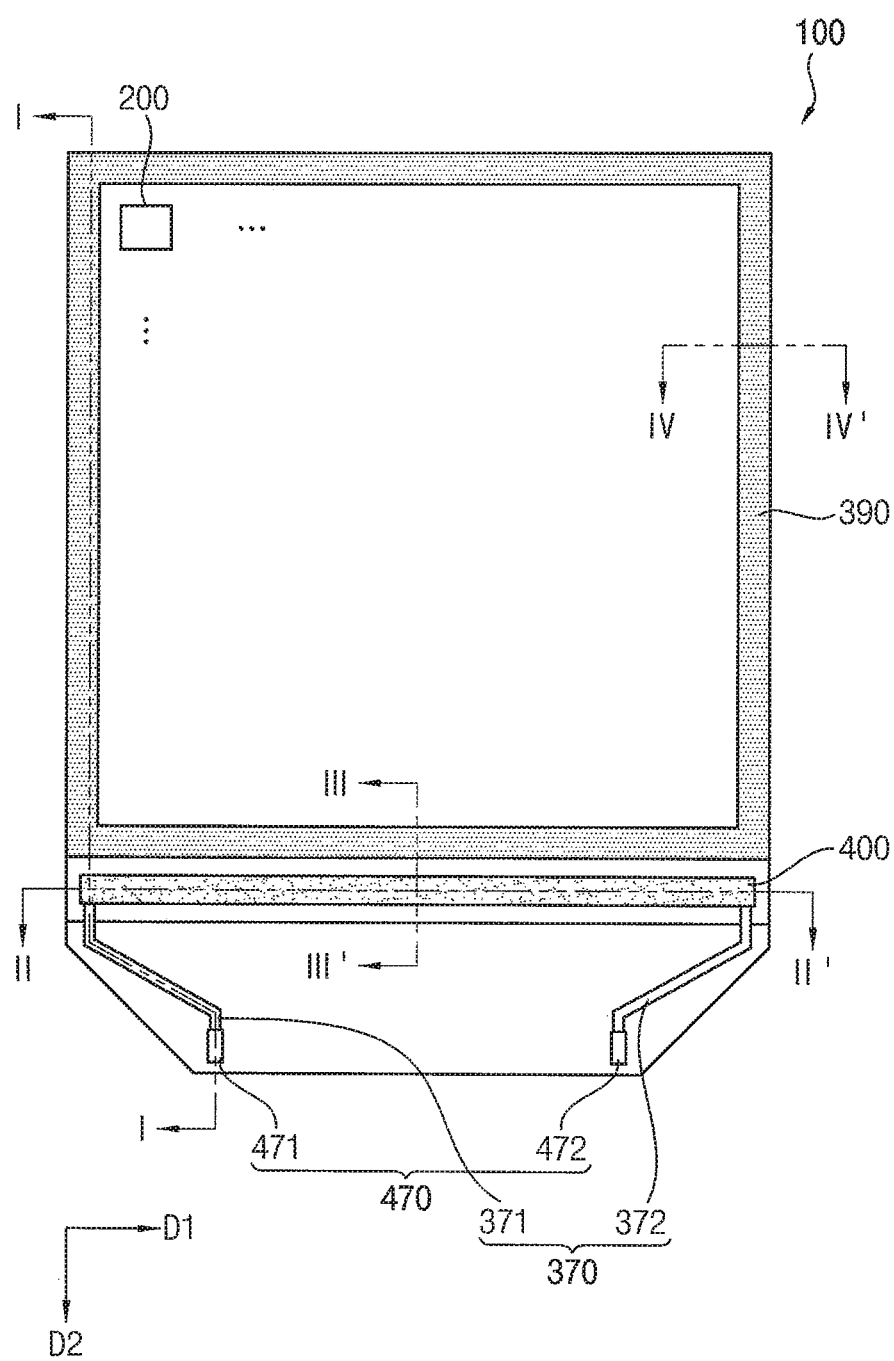
FIG. 2 is a plan view illustrating elements of an OLED device in accordance with embodiments.
Figure 3:
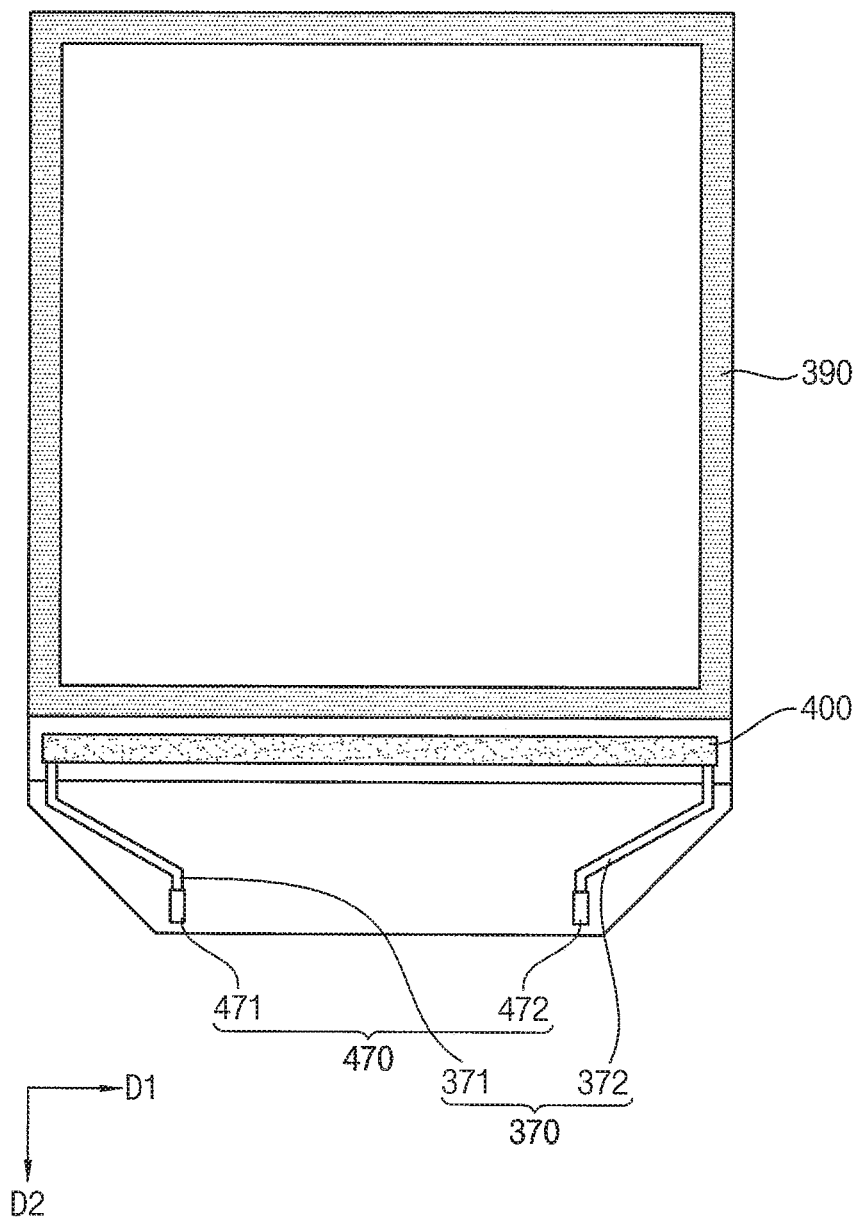
FIG. 3 is a plan view illustrating elements of an OLED device in accordance with embodiments.
Figure 4:
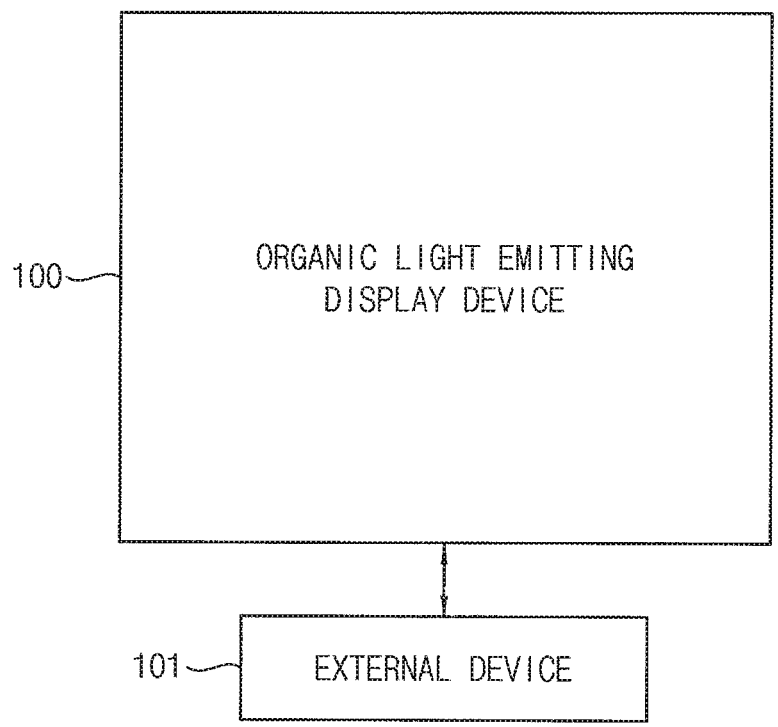
FIG. 4 is a block diagram illustrating an external device electrically connected to an OLED device in accordance with embodiments.

FIGS. 1, 2, and 3 are plan views illustrating elements of an organic light emitting display (OLED) device in accordance with example embodiments. FIG. 4 is a block diagram illustrating an external device electrically connected to the OLED device in accordance with example embodiments.

Referring to FIGS. 1, 2, 3, and 4, an OLED device 100 may include a display region 10, a peripheral region 20, and a pad region 30. The peripheral region 20 may surround the display region 10, and the pad region 30 may be located at one side of the peripheral region 20. The peripheral region 20 may include a first peripheral region 21 located between the display region 10 and the pad region 30 and may include a second peripheral region 22 that is directly connected to the first peripheral region 21. The first peripheral region 21 may be/include a bottom portion of the peripheral region 20, and the second peripheral region 22 may include left, right, and top portions of the peripheral region 20. In example embodiments, a width, of the left portion of the peripheral region 20 in a first direction D1, a width of the right portion of the peripheral region 20 in a first direction D1, and a width of the top portion of the peripheral region 20 in a second direction D2 may be substantially equal and may be each less than a width of the first peripheral region 21 in the second direction D2. The first direction D1 may be (parallel to) the lengthwise direction of the first peripheral region 21, and the second direction D2 may be perpendicular to the first direction D1. The pad region 30 may have a gradually reduced width in the second direction D2. The pad region 30 may have a trapezoid shape in a plan view of the OLED device 100. A center portion of the pad region 30 may have a uniform width in the second direction D2.

In example embodiments, a shape of each of the display region 10 and the peripheral region 20 has a plan-view shape of a tetragon. In example embodiments, each of the display region 10 and the peripheral region 20 may have a plan-view shape of a triangle, a plan-view shape of a diamond, a plan-view shape of a polygon, a plan-view shape of a circle, a plan-view shape of an athletic track, a plan-view shape of an elliptic, etc.

Referring again to FIGS. 1, 2, 3, and 4, the OLED device 100 may include light emitting structures 200, a seal member 390, a seal pattern 400, a pad electrode 470 (or pad electrode set 470), a connection wire 370 (or connection wire set 370), etc.

The light emitting structures 200 (e.g., a light emitting structure 200 illustrated FIG. 7A or FIG. 7B) may be disposed in the display region 10. The light emitting structures 200 may be arranged along the directions D1 and D2 in the display region 10 and may display an image. The light emitting structures 200 may be arranged using at least one of an RGB stripe method where tetragons of a same size are sequentially arranged, an s-stripe method including a blue OLED having a relatively large area, a WRGB method including a white OLED, a pen-tile method repeatedly arranged in an RG-GB pattern, etc.

The seal member 390 may be disposed in the peripheral region 20 of the OLED device 100. The seal member 390 may be disposed in the second peripheral region 22 and a portion of the first peripheral region 21, and may have a plan-view shape of a hollow tetragon. The seal member 390 may include non-conductive materials. The seal member 390 may overlap first and second distal ends (e.g., two lateral portions) of the seal pattern 400, and/or may have protruding portions that protrude beyond the first and second distal ends of the seal pattern 400 in the first direction D1. In a process for manufacturing the OLED device 100, the protruding portions may correspond to a start point and/or an end point to form the seal member 390. The seal pattern 400 may overlap the protruding portions and/or may be spaced apart from the protruding portions. The protruding portions may include conductive materials or non-conductive materials.

The seal pattern 400 may be spaced apart from the seal member 390 in the second direction D2 and may be disposed in a remaining portion of the first peripheral region 21. The seal pattern 400 may extend in the first direction D1 and may have a plan-view shape of a bar. The seal pattern 400 may include one or more conductive materials.

In example embodiments, the seal pattern 400 may be disposed in the second peripheral region 22 or a portion of each of the peripheral regions 21 and 22 each, and may have a bent shape.

The pad electrode 470 may be disposed in the pad region 30 of the OLED device 100. The pad electrode 470 may include a first pad electrode 471 and a second pad electrode 472. The first pad electrode 471 may be located at a left side of the pad region 30, and the second pad electrode 472 may be located at a right side of the pad region 30. In some example embodiments, a plurality of extra pad electrodes may be disposed between the first pad electrode 471 and the second pad electrode 472.

The connection wire 370 may be disposed in both the first peripheral region 21 and the pad region 30 of the OLED device 100. The connection wire 370 may include a first connection wire 371 and a second connection wire 372. A first distal end of the first connection wire 371 may be directly coupled (or directly connected) to a first side portion of the seal pattern 400, and a second distal end, which is opposite the first distal end, of the first connection wire 371 may be directly coupled to the first pad electrode 471. The first connection wire 371 may electrically connect the seal pattern 400 and the first pad electrode 471. The first distal end of the first connection wire 371 may overlap the first side portion of the seal pattern 400, and the second distal end of the first connection wire 371 may overlap the first pad electrode 471. A first distal end of the second connection wire 372 may be coupled to a second side portion, which is opposite the first side portion of the seal pattern 400, of the seal pattern 400, and a second distal end, which is opposite the first distal end of the second connection wire 372, of the second connection wire 372 may be coupled to the second pad electrode 472. The second connection wire 372 may electrically connect the seal pattern 400 and the second pad electrode 472. The first distal end of the second connection wire 372 may overlap the first side portion of the seal pattern 400, and the second distal end of the second connection wire 372 may overlap the second pad electrode 472.

Referring to FIG. 4, an external device 101 may be electrically connected to the OLED device 100 through a flexible printed circuit board (FPCB). One side of the FPCB may be in direct contact with the pad electrode 470, and another side of the FPCB may be in direct contact with the external device 101. The external device 101 may be electrically connected to the first pad electrode 471 and the second pad electrode 472 and may measure a resistance value between the pad electrodes 471 and 472.

In a manufacturing process of an OLED device, a seal member may adhere to (or bond) the lower and upper substrates included in the OLED device. The lower substrate may protrude from the upper substrate in the second direction D2. After the lower substrate and the upper substrate are adhered to each other, portions of a pad region may be removed to reduce an unutilized space of the conventional OLED device, and a portion of the seal member may be removed. As a result, the lower substrate and/or the upper substrate may be detached from the seal member near a boundary of a peripheral region and the pad region. A portion of the seal member disposed near the boundary of the peripheral region and the pad region may be detached from at least one of the lower and upper substrates by an external impact (e.g., a cut portions of the pad region and/or a cut of an outer portion of the seal member) generated in the manufacturing process of the conventional OLED device. When the seal member is detached from at least one of the lower and upper substrates, a seal defect of the OLED device may occur. It may be difficult to visually observe the seal defect due to a window disposed on the upper substrate, inorganic insulation layers disposed between the lower substrate and the seal member, a lower film disposed under the lower substrate, etc.

In example embodiments, the OLED device 100 may include the seal pattern 400, the pad electrode 470, and the connection wire 370. Since the seal pattern 400 is disposed adjacent to the seal member 390, delamination/detachment may occur in the seal pattern 400 when delamination/detachment occurs in the seal member 390 near a boundary of the peripheral region 20 and the pad region 30 by the external impact. When no delamination/detachment occurs in the seal member 390, no delamination/detachment may occur in the seal pattern 400. As the seal pattern 400 includes one or more conductive materials, the OLED device 100 and/or the external device 101 may measure a resistance value between the pad electrodes 471 and 472. The OLED device 100 and/or the external device 101 may check whether the seal member 390 and the seal pattern 400 are defective using the resistance value. For example, when delamination/detachment occurs, the resistance value may significantly increase, and/or the pad electrodes 471 and 472 may be electrically disconnected from each other. The seal member 390 and the seal pattern 400 may be repaired after the detection of the delamination/detachment. OLED devices with defective seal members may not be provided to consumers.

In some example embodiments, the external device 101 may generate a data signal, a gate signal, a light emission signal, a gate initialization signal, an initialization voltage, a power supply, etc. Extra pad electrodes may be disposed between the pad electrodes 471 and 472, and the external device 101 may be electrically connected to the extra pad electrodes. The external device 101 may provide the data signal, the gate signal, the light emission signal, the gate initialization signal, the initialization voltage, the power supply, etc. through the extra pad electrodes to the OLED device 100. A driving integrated circuit may be installed in the FPCB. Alternatively, the driving integrated circuit may be installed in a portion, of the OLED device 100.

Figure 5:
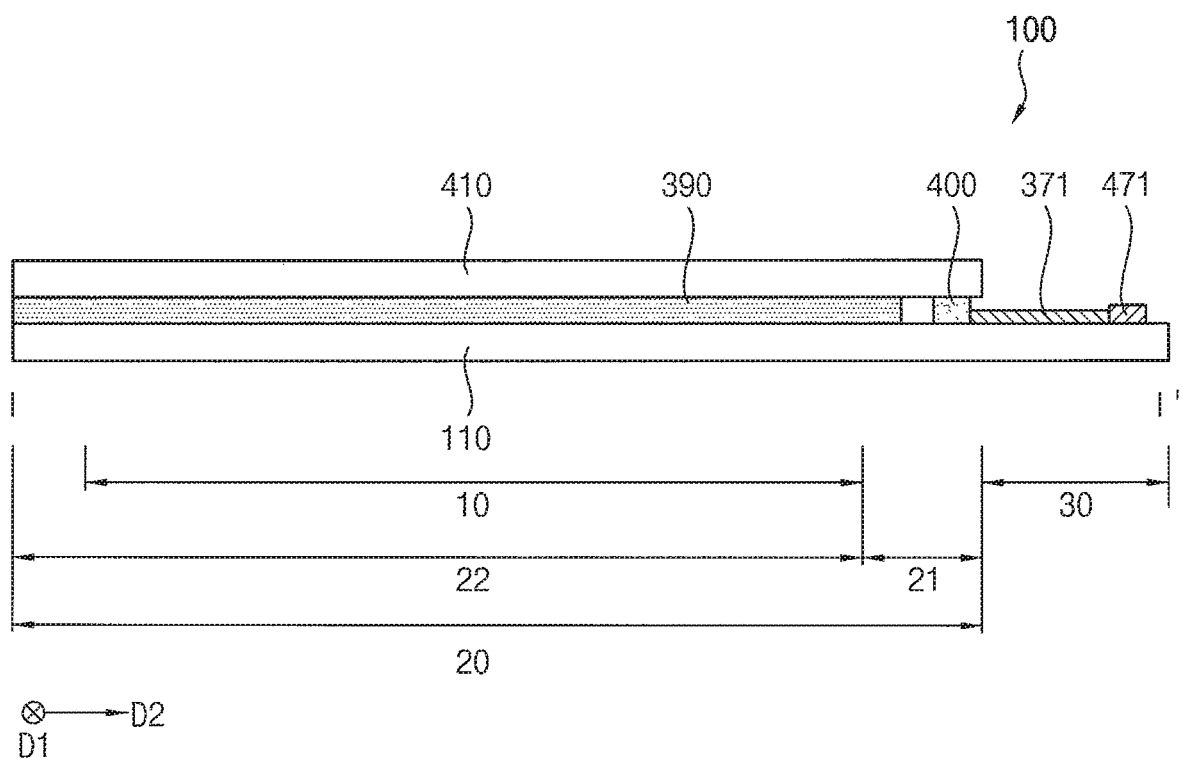
FIG. 5 is a cross-sectional view taken along a line I-I' of FIG. 2 in accordance with embodiments.
Figure 6:
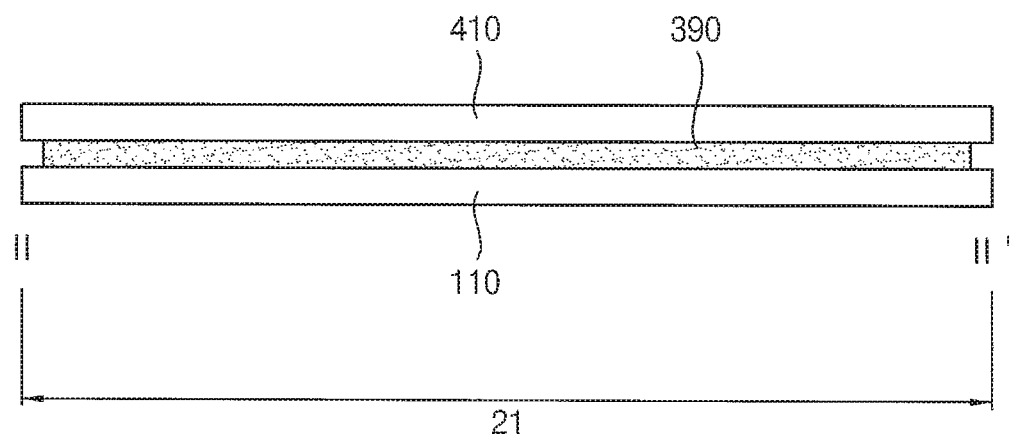
FIG. 6 is a cross-sectional view taken along a line II-II' of FIG. 2 in accordance with embodiments.
Figure 7B:
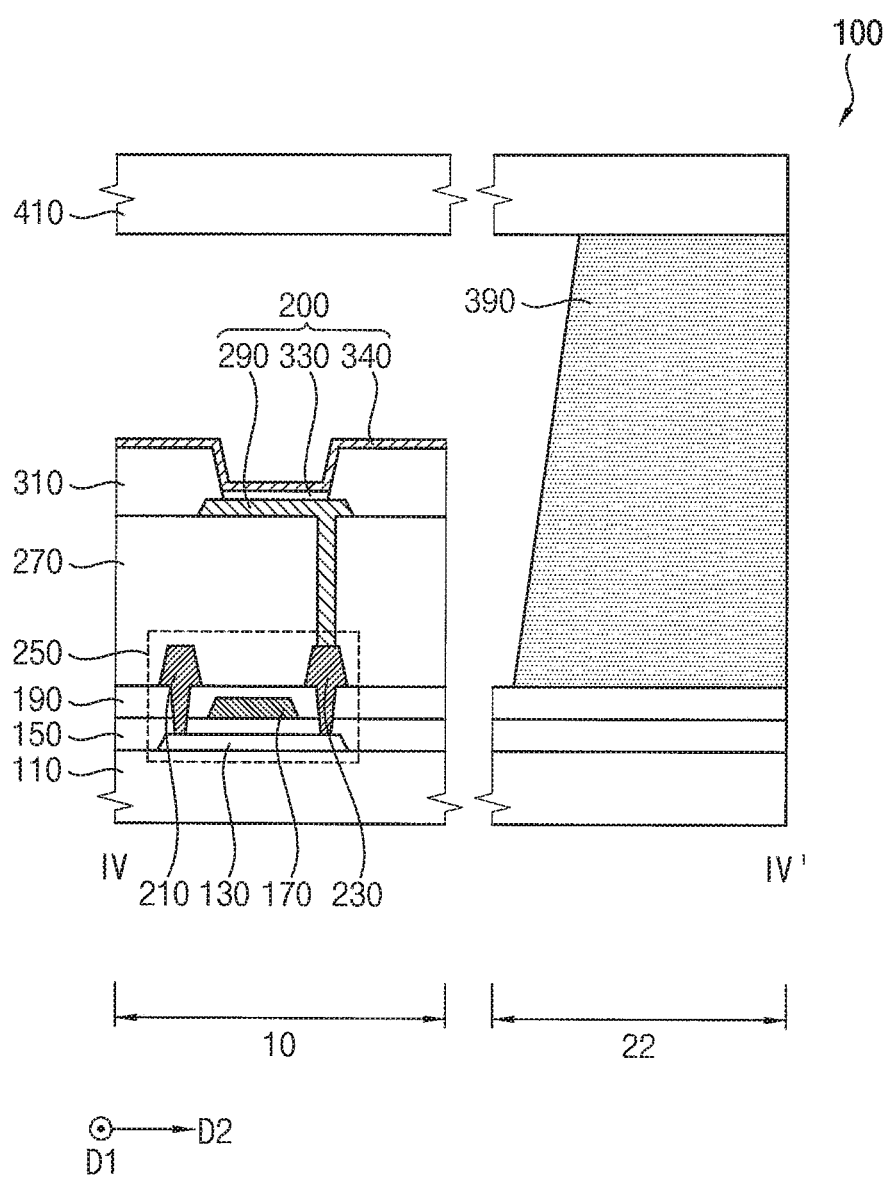
FIG. 7B is a cross-sectional view taken along a line IV-IV' of FIG. 2 in accordance with embodiments.

FIG. 5 is a cross-sectional view taken along a line I-I' of FIG. 2 according to embodiments. FIG. 6 is a cross-sectional view taken along a line II-II' of FIG. 2 according to embodiments. FIG. 7A is a cross-sectional view taken along a line III-III' of FIG. 2 according to embodiments. FIG. 7B is a cross-sectional view taken along a line IV-IV' of FIG. 2 according to embodiments.

Referring to FIGS. 2, 5, 6, 7A, and 7B, an OLED device 100 may include a lower substrate 110, a semiconductor element 250, a planarization layer 270, a light emitting structure 200, a seal member 390, a seal pattern 400, a connection wire 370, a pad electrode 470, an upper substrate 410, etc. The semiconductor element 250 may include an active layer 130, a gate insulation layer 150, a gate electrode 170, an insulating interlayer 190, a source electrode 210, and a drain electrode 230. The light emitting structure 200 may include a lower electrode 290, a light emitting layer 330, and an upper electrode 340. The connection wire 370 may include a first connection wire 371 and a second connection wire 372. The pad electrode 470 may include a first pad electrode 471 and a second pad electrode 472. As the OLED device 100 has a display region 10, a peripheral region 20, and a pad region 30, the lower substrate 110 may include regions corresponding to the display region 10, the peripheral region 20, and the pad region 30. The peripheral region 20 may include a first peripheral region 21 and a second peripheral region 22. A portion of an image may be displayed in the display region 10 by the light emitting structure 200 and the semiconductor element 250. The lower substrate 110 and the upper substrate 410 may be sealed in the peripheral region 20 by the seal member 390 and the seal pattern 400.

The lower substrate 110 may include one or more transparent or opaque insulation materials. The lower substrate 110 may be located in the display region 10, the peripheral region 20, and the pad region 30. The lower substrate 110 and the upper substrate 410 may overlap in the display region 10 and the peripheral region 20, and the lower substrate 110 may protrude beyond the upper substrate 410 in the pad region 30. The lower substrate 110 may include at least one of a quartz substrate, a synthetic quartz substrate, a calcium fluoride substrate, a fluoride-doped quartz substrate, a soda-lime glass substrate, a non-alkali glass substrate etc.

The lower substrate 110 may include a flexible transparent material such as a flexible transparent resin substrate (e.g., a polyimide substrate). The polyimide substrate may include a first polyimide layer, a barrier film layer, a second polyimide layer, etc. The first polyimide layer, the barrier film layer, and the second polyimide layer may be sequentially stacked on a rigid glass substrate. In a method of manufacturing the OLED device 100, after an insulation layer (e.g., a buffer layer) is disposed on the second polyimide layer of the polyimide substrate, an upper structure (e.g., the semiconductor element 250 and the light emitting structure 200) may be formed on the insulation layer. After the upper structure is formed on the insulation layer, the rigid glass substrate on which the polyimide substrate is formed may be removed. That is, it may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the lower substrate 110 after the removal of the rigid glass substrate.

A buffer layer (not shown) may be disposed on the entire lower substrate 110. The buffer layer may prevent the diffusion of metal atoms and/or impurities from the lower substrate 110 into the semiconductor element 250 and the light emitting structure 200. The buffer layer may control a rate of a heat transfer in a crystallization process for forming the active layer 130, thereby forming a substantially uniform active layer 130. The buffer layer may improve surface flatness over the lower substrate 110 when a surface of the lower substrate 110 is relatively irregular. According to embodiments, at least two buffer layers may be provided on the lower substrate 110, or the buffer layer may be unnecessary. The buffer layer may include an organic material and/or an inorganic material.

The active layer 130 may be disposed in the display region 10 on the lower substrate 110. The active layer 130 may include a metal oxide semiconductor, an inorganic semiconductor (e.g., amorphous silicon or polysilicon), or an organic semiconductor. The active layer 130 may have a source region and a drain region.

The gate insulation layer 150 may be disposed on the active layer 130. The gate insulation layer 150 may cover the active layer 130 in the display region 10 on the lower substrate 110. The gate insulation layer 150 may be disposed in the display region 10, the peripheral region 20, and the pad region 30 on the lower substrate 110. The gate insulation layer 150 may sufficiently cover the active layer 130 on the lower substrate 110, and may have a substantially flat upper surface without a step around the active layer 130. Alternatively, the gate insulation layer 150 may cover the active layer 130 on the lower substrate 110, and may have a substantially uniform thickness along a profile of the active layer 130. The gate insulation layer 150 may include at least one of silicon compound, metal oxide, etc. The gate insulation layer 150 may include at least one of silicon oxide (SiO), silicon nitride (SiN), silicon oxynitride (SiON), silicon oxycarbide (SiOC), silicon carbon nitride (SiCN), aluminum oxide (AlO), aluminum nitride (AlN), tantalum oxide (TaO), hafnium oxide (HfO), zirconium oxide (ZrO), titanium oxide (TiO), etc. In some example embodiments, the gate insulation layer 150 may have a multi-layered structure including a plurality of insulation layers. The insulation layers may have different thicknesses and/or may include different materials.

The gate electrode 170 may be insulated from the active layer 130 by the gate insulation layer 150 and may overlap the active layer 130. The gate electrode 170 may include at least one of a metal, a metal alloy, metal nitride, conductive metal oxide, transparent conductive materials, etc. The gate electrode 170 may include at least one of gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Jr), an alloy of aluminum, aluminum nitride (AlN), an alloy of silver, tungsten nitride (WN), an alloy of copper, an alloy of molybdenum, titanium nitride (TiN), chromium nitride (CrN), tantalum nitride (TaN), strontium ruthenium oxide (SRO), zinc oxide (ZnO), indium tin oxide (ITO), stannum oxide (SnO), indium oxide (InO), gallium oxide (GaO), indium zinc oxide (IZO), etc. Some of these materials may be used alone or in a suitable combination. In some example embodiments, the gate electrode 170 may have a multi-layered structure including a plurality of layers.

The insulating interlayer 190 may be disposed on the gate electrode 170. The insulating interlayer 190 may cover the gate electrode 170 in the display region 10 on the gate insulation layer 150. The insulating interlayer 190 may be disposed in the display region 10, the peripheral region 20, and the pad region 30 on the gate insulation layer 150. The insulating interlayer 190 may sufficiently cover the gate electrode 170 and may have a substantially flat upper surface without a step around the gate electrode 170. Alternatively, the insulating interlayer 190 may cover the gate electrode 170 and may have a substantially uniform thickness along a profile of the gate electrode 170. The insulating interlayer 190 may include at least one of silicon compound, metal oxide, etc. In some example embodiments, the insulating interlayer 190 may have a multi-layered structure including a plurality of insulation layers. The insulation layers may have different thicknesses and/or include different materials.

The source electrode 210 and the drain electrode 230 may be disposed in the display region 10 on the insulating interlayer 190. The source electrode 210 may be connected to (or in direct contact with) the source region of the active layer 130 via a first contact hole formed through the gate insulation layer 150 and the insulating interlayer 190. The drain electrode 230 may be connected to the drain region of the active layer 130 via a second contact hole formed through the gate insulation layer 150 and the insulating interlayer 190. Each of the source electrode 210 and the drain electrode 230 may include at least one of a metal, an alloy, metal nitride, conductive metal oxide, transparent conductive materials, etc. Some of these materials may be used alone or in a suitable combination. Each of the source and drain electrodes 210 and 230 may have a multi-layered structure including a plurality of layers.

In example embodiments, the light emitting structure 200 may be electrically connected to one transistor (e.g., the semiconductor element 250). The light emitting structure 200 may be electrically connected to may electrically connected to at least two semiconductor elements and/or at least one capacitor.

The semiconductor element 250 may have a top gate structure. The semiconductor element 250 may have a bottom gate structure and/or a double gate structure.

The planarization layer 270 may be disposed in the display region 10 on the insulating interlayer 190 and on the electrodes 210 and 230, and may not be disposed in the peripheral region 20 and the pad region 30. The planarization layer 270 may have a large thickness to sufficiently cover the electrodes 210 and 230 on the insulating interlayer 190. The planarization layer 270 may have a substantially flat upper surface, and a planarization process may be performed on the planarization layer 270 to implement the flat upper surface of the planarization layer 270. A portion of an upper surface of the drain electrode 230 may be exposed via a contact hole formed through the planarization layer 270. The planarization layer 270 may include an organic material and/or an inorganic material. In example embodiments, the planarization layer 270 may include at least one organic material such as at least one of polyimide, epoxy-based resin, acryl-based resin, polyester, photoresist, polyacryl-based resin, polyimide-based resin, a polyamide-based resin, a siloxane-based resin, etc.

The lower electrode 290 may be disposed in the display region 10 on the planarization layer 270. The lower electrode 290 may be in direct contact with to the drain electrode 230 via the contact hole of the planarization layer 270, and may be electrically connected to the semiconductor element 250. The lower electrode 290 may include at least one of a metal, a metal alloy, metal nitride, conductive metal oxide, transparent conductive materials, etc. Some of these materials may be used alone or in a suitable combination. The lower electrode 290 may have a multi-layered structure including a plurality of layers.

The pixel defining layer 310 may be disposed in the display region 10 on a portion of the lower electrode 290 and the planarization layer 270. The pixel defining layer 310 may cover lateral portions of the lower electrode 290 and may expose a portion of an upper surface of the lower electrode 290. The pixel defining layer 310 may include an organic material and/or an inorganic material. In example embodiments, the pixel defining layer 310 may include one or more organic materials.

The light emitting layer 330 may be disposed in the display region 10 on the lower electrode 290 exposed by the pixel defining layer 310. The light emitting layer 330 may be formed using a light emitting material capable of emitting light of a predetermined color (e.g., a red light, a blue light, or a green light). The light emitting layer 330 may generate a white color of light and may include light emitting materials capable of generating light of different colors, such as a red light, a green light, and a blue light. A color filter may overlap the light emitting layer 330. The color filter may include at least one of a red color filter, a green color filter, and a blue color filter. The color filter may include at least one of a yellow color filter, a cyan color filter, and a magenta color filter. The color filter may include at least one of a photosensitive resin, color photoresist, etc.

The upper electrode 340 may be disposed in the display region 10 on the pixel defining layer 310 and the light emitting layer 330. The upper electrode 340 may include at least one of a metal, a metal alloy, metal nitride, conductive metal oxide, transparent conductive materials, etc. Some of these materials may be used alone or in a suitable combination. The upper electrode 340 may have a multi-layered structure including a plurality of layers.

The seal member 390 may be disposed in the peripheral region 20 on the insulating interlayer 190. The seal member 390 may be disposed between the lower substrate 110 and the upper substrate 410 in the second peripheral region 22 and a portion of the first peripheral region 21. The seal member 390 may have a plan-view shape of a hollow tetragon. In example embodiments, a section of the seal member 390 (e.g., illustrated in FIG. 7A) located in the first peripheral region 21 may have an acute-trapezoid cross section, and a section of the seal member 390 (e.g., illustrated in FIG. 7B) located in the second peripheral region 22 may have a right-angled-trapezoid cross section where a width of an upper side is less than a width of a lower side. An outermost surface of the seal member 390 located in the second peripheral region 22 may be substantially coplanar with a side wall of the lower substrate 110, a side wall of the gate insulation layer 150, a side wall of the insulating interlayer 190, and a side wall of the upper substrate 410. In a manufacturing process of the OLED device 100, a portion of the lower substrate 110, a portion of the gate insulation layer 150, a portion of the insulating interlayer 190, a portion of the seal member 390, and a portion of the upper substrate 410 that are located in the second peripheral region 22 may be cut to reduce an unutilized space of the OLED device 100.

The seal member 390 may be in direct contact with an upper surface of the insulating interlayer 190 and a lower surface of the upper substrate 410. In example embodiments, the seal member 390 may include one or more non-conductive materials. The seal member 390 may include frit, etc. The seal member 390 may include a photo curable material. The seal member 390 may include a compound of an organic material and a photo curable material. One or more of ultraviolet ray, laser beam, visible ray, etc. may be irradiated to the compound for forming the seal member 390. The photo curable material included in the seal member 390 may include at least one of epoxy acrylate-based resin, polyester acrylate-based resin, urethane acrylate based-resin, polybutadiene acrylate-based resin, silicon acrylate-based resin, alkyl acrylate-based resin, etc.

A laser may be irradiated in the compound. According to an irradiation of the laser, a state of the compound (and the seal member 390) may be changed from a solid state to a liquid state. The compound of the liquid state may be cured to the solid state after a predetermined time. Because of the state change of the compound, the compound may bond the lower substrate 110 and the upper substrate 410.

In example embodiments, the seal member 390 has at least one trapezoid cross section where a width of an upper side is less than a width of a lower side. The seal member 390 may have at least one of a trapezoidal cross section where a width of an upper side is greater than a width of a lower side, a rectangular cross section, a square cross section, etc.

The seal pattern 400 may be disposed in the first peripheral region 21 on the insulating interlayer 190 and may be spaced apart from the seal member 390 in the second direction D2. The seal pattern 400 may be disposed between the lower substrate 110 and the upper substrate 410 and may extend in a first direction D1. In example embodiments, the seal pattern 400 may have a plan-view shape of a bar.

The seal pattern 400 may be in direct contact with an upper surface of the insulating interlayer 190, a lower surface of the upper substrate 410, and a first distal end of the connection wire 370. The first distal end of the connection wire 370 may overlap the seal pattern 400. In example embodiments, the seal pattern 400 may include one or more conductive materials. The seal pattern 400 may be electrically connected to the connection wire 370. The seal pattern 400 may include frit including a conductive material. The seal pattern 400 may include a photo curable material. The seal pattern 400 may include a compound of an organic material and a photo curable material. One or more of ultraviolet ray, laser beam, visible ray, etc. may be irradiated to the compound for forming the seal pattern 400.

In example embodiments, the seal pattern 400 has a trapezoid cross section. The seal pattern 400 may have at least one of a reversed-trapezoidal cross section, a rectangular cross section, a square cross section, etc.

The upper substrate 410 may be disposed on the seal member 390, the seal pattern 400, and the upper electrode 340. The upper substrate 410 may overlap the lower substrate 110 and may expose a portion of the lower substrate 110 located in the pad region 30. The upper substrate 410 and the lower substrate 110 may include substantially same materials. The upper substrate 410 may include at least one of a quartz substrate, a synthetic quartz substrate, a calcium fluoride substrate, a fluoride-doped quartz substrate, a soda-lime glass substrate, a non-alkali glass substrate, etc. In some example embodiments, the upper substrate 410 may include a transparent inorganic material or flexible plastic. The upper substrate 410 may include a flexible transparent resin substrate. To increase flexibility of the OLED device 100, the upper substrate 410 may have a stacked structure where at least one inorganic layer and at least one organic layer are alternately stacked. The stack structure may include a flexible first inorganic layer, a flexible organic layer, and a flexible second inorganic layer. The first inorganic layer may be disposed along a profile of the upper electrode 340, the organic layer having flexibility may be disposed on the first inorganic layer, and the second inorganic layer may be disposed on the organic layer. The stack structure may overlap or function as a thin film encapsulation structure that is in direct contact with the upper electrode 340.

The pad electrode 470 may be disposed in the pad region 30 on the lower substrate 110. The pad electrode 470 may be in direct contact with a second distal end of the connection wire 370. The pad electrode 470 may be electrically connected to the connection wire 370. The second distal end of the connection wire 370 may overlap the pad electrode 470. The pad electrode 470 may include at least one of a metal, an alloy of a metal, metal nitride, conductive metal oxide, transparent conductive materials, etc. Some of these materials may be used alone or in a suitable combination. The pad electrode 470 may have a multi-layered structure including a plurality of layers.

The connection wire 370 may be disposed in both the first peripheral region 21 and the pad region 30 on the lower substrate 110. The connection wire 370 may electrically connect the seal pattern 400 and the pad electrode 470. The connection wire 370 may include at least one of a metal, an alloy of a metal, metal nitride, conductive metal oxide, transparent conductive materials, etc. Some of these may materials be used alone or in a suitable combination. The connection wire 370 may have a multi-layered structure including a plurality of layers.

As the OLED device 100 includes the seal pattern 400, the pad electrode 470, and the connection wire 370, the OLED device 100 and/or an external device may check whether the seal member 390 is defective based on a resistance value between the first and second pad electrodes 471 and 472. A seal defeat of the OLED device 100 may be detected and repaired.

As the seal pattern 400 is disposed near a boundary of the peripheral region 20 and the pad region 30, an adhesive force between the lower substrate 110 and the upper substrate 410 may be strengthened near the boundary of the peripheral region 20 and the pad region 30. Advantageously, potential delamination/detachment of the substrates 110 and 410 near the boundary of the peripheral region 20 and the pad region 30 may be substantially prevented.

Figure 8:
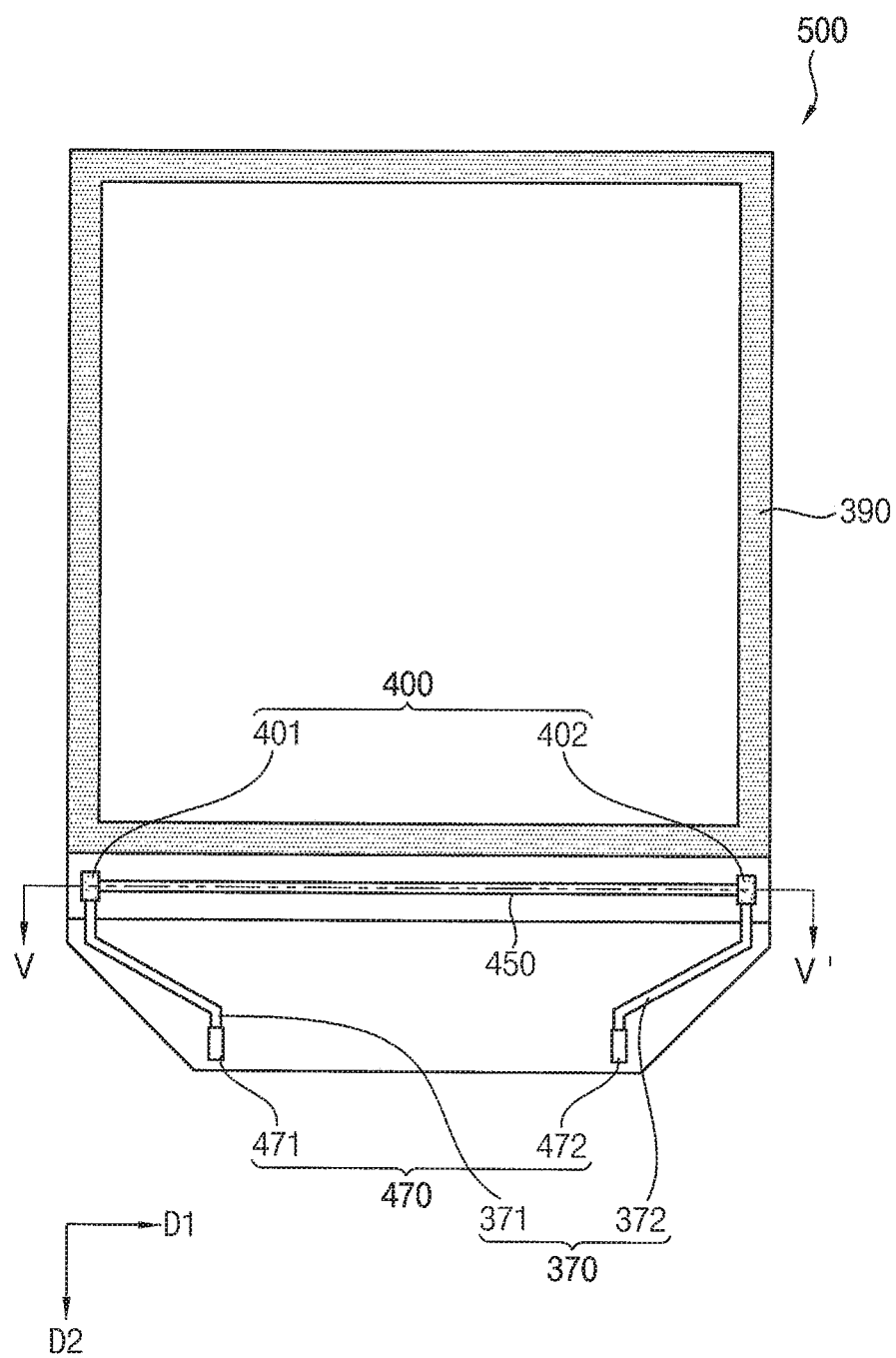
FIG. 8 is a plan view illustrating elements of an OLED device in accordance with embodiments.
Figure 9:
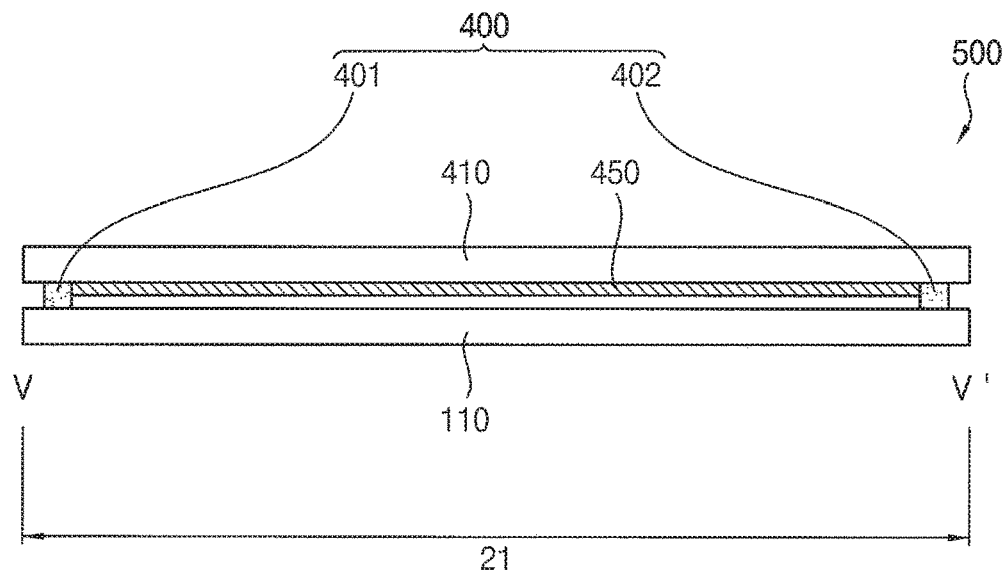
FIG. 9 is a cross-sectional view taken along a line V-V' of FIG. 8 in accordance with embodiments.
Figure 10:
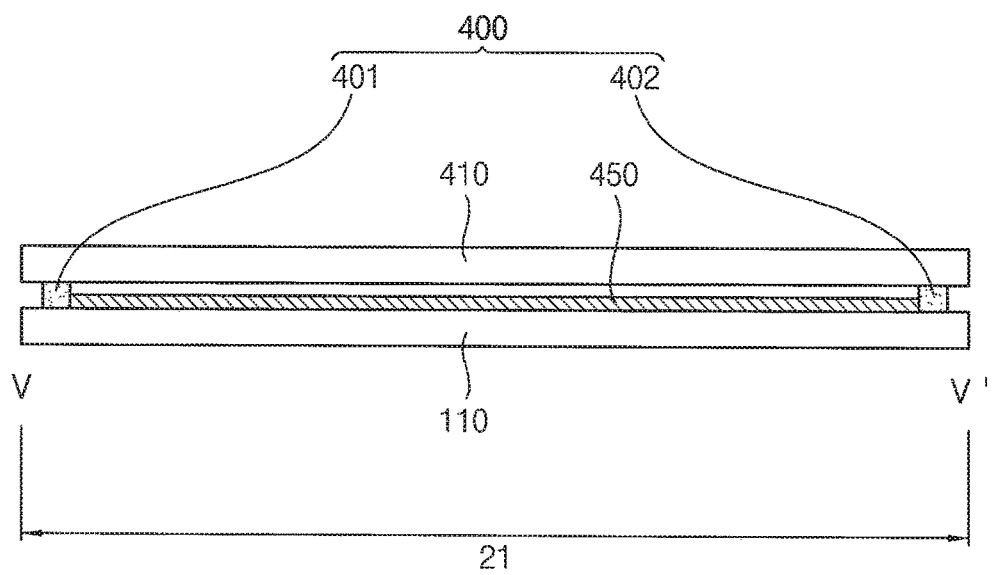
FIG. 10 is a cross-sectional view taken along a line V-V' of FIG. 8 in accordance with embodiments.

FIG. 8 is a plan view illustrating elements of an OLED device 500 in accordance with example embodiments. FIG. 9 is a cross-sectional view taken along a line V-V' of FIG. 8 in accordance with example embodiments. FIG. 10 is a cross-sectional view taken along a line V-V' of FIG. 8 in accordance with example embodiments. The OLED device 500 may have elements substantially the same as or similar to elements described with reference to one or more of FIGS. 1 through 7B except for a first seal pattern 401, a second seal pattern 402, and a connection electrode 450. Detailed descriptions for elements that are substantially the same as or similar to elements described with reference to one or more of FIGS. 1 through 7B may not be repeated.

Referring FIGS. 8 and 9, the OLED device 500 may include a lower substrate 110, a semiconductor element 250, a planarization layer 270, a light emitting structure 200, a seal member 390, a seal pattern 400, a connection wire 370, a connection electrode 450, a pad electrode 470, an upper substrate 410, etc. The connection wire 370 may include a first connection wire 371 and a second connection wire 372, and the pad electrode 470 may include a first pad electrode 471 and a second pad electrode 472. The seal pattern 400 may include a first seal pattern 401 and a second seal pattern 402.

The seal pattern 400 may be disposed in the first peripheral region 21 on the insulating interlayer 190, and may be spaced apart from the seal member 390 in the second direction D2. The first seal pattern 401 may be disposed at a left side of the first peripheral region 21, and the second seal pattern 402 may be disposed at a right side of the first peripheral region 21. The first seal pattern 401 and the second seal pattern 402 may be spaced apart from each other.

The first seal pattern 401 may be in direct contact with an upper surface of the insulating interlayer 190, a lower surface of the upper substrate 410, and a first distal end of the connection wire 370. The first distal end of the first connection wire 371 may overlap the first seal pattern 401, and a first distal end of the second connection wire 372 may overlap the second seal pattern 402. In example embodiments, the seal pattern 400 may include one or more conductive materials. The seal pattern 400 may be electrically connected to the connection wire 370 and the connection electrode 450. The seal pattern 400 may include frit including a conductive material.

The connection electrode 450 may be disposed between the first seal pattern 401 and the second seal pattern 402. The connection electrode 450 may electrically connect the first seal pattern 401 and the second seal pattern 402. The connection electrode 450 may be in direct contact with the first seal pattern 401 and the second seal pattern 402. A first distal end of the connection electrode 450 may overlap the first seal pattern 401, and a second distal end, which is opposite to the first distal end of the connection electrode 450, of the connection electrode 450 may overlap the second seal pattern 402. As illustrated in FIG. 9, the connection electrode 450 may be disposed on a lower surface of the upper substrate 410. As illustrated in FIG. 10, the connection electrode 450 may be disposed on an upper surface of the lower substrate 110. The connection electrode 450 may include at least one of a metal, an alloy of a metal, metal nitride, conductive metal oxide, transparent conductive materials, etc. Some of these materials may be used alone or in suitable combination. In some example embodiments, the connection electrode 450 may have a multi-layered structure including a plurality of layers.

In a process for manufacturing the OLED device 500, the seal member 390 may have first and second protrusions in the first peripheral region 21. The first and second protrusions may correspond to a start point and/or an end point to form the seal member 390. In example embodiments, the first protrusion may be used for forming the first seal pattern 401, and the second protrusion may be used for forming the second seal pattern 402. A portion of the first protrusion and a portion of the second protrusion may be removed such that the first and second protrusions portions are spaced apart from the seal member 390 to form the seal patterns 401 and 402. The second protrusions may include one or more conductive materials, such that the seal patterns 401 and 402 may be conductive. As the connection electrode 450 is formed between the seal patterns 401 and 402, an external device 101 may measure a resistance value between the first pad electrode 471 and the second pad electrode 472. Accordingly, the OLED device 500 and/or the external device may check whether the seal member 390 is defective using the resistance value. Since the seal pattern 400 is formed using the first and second protrusions of the seal member 390, a manufacturing cost of the OLED device 500 may be minimized.

Figure 11:
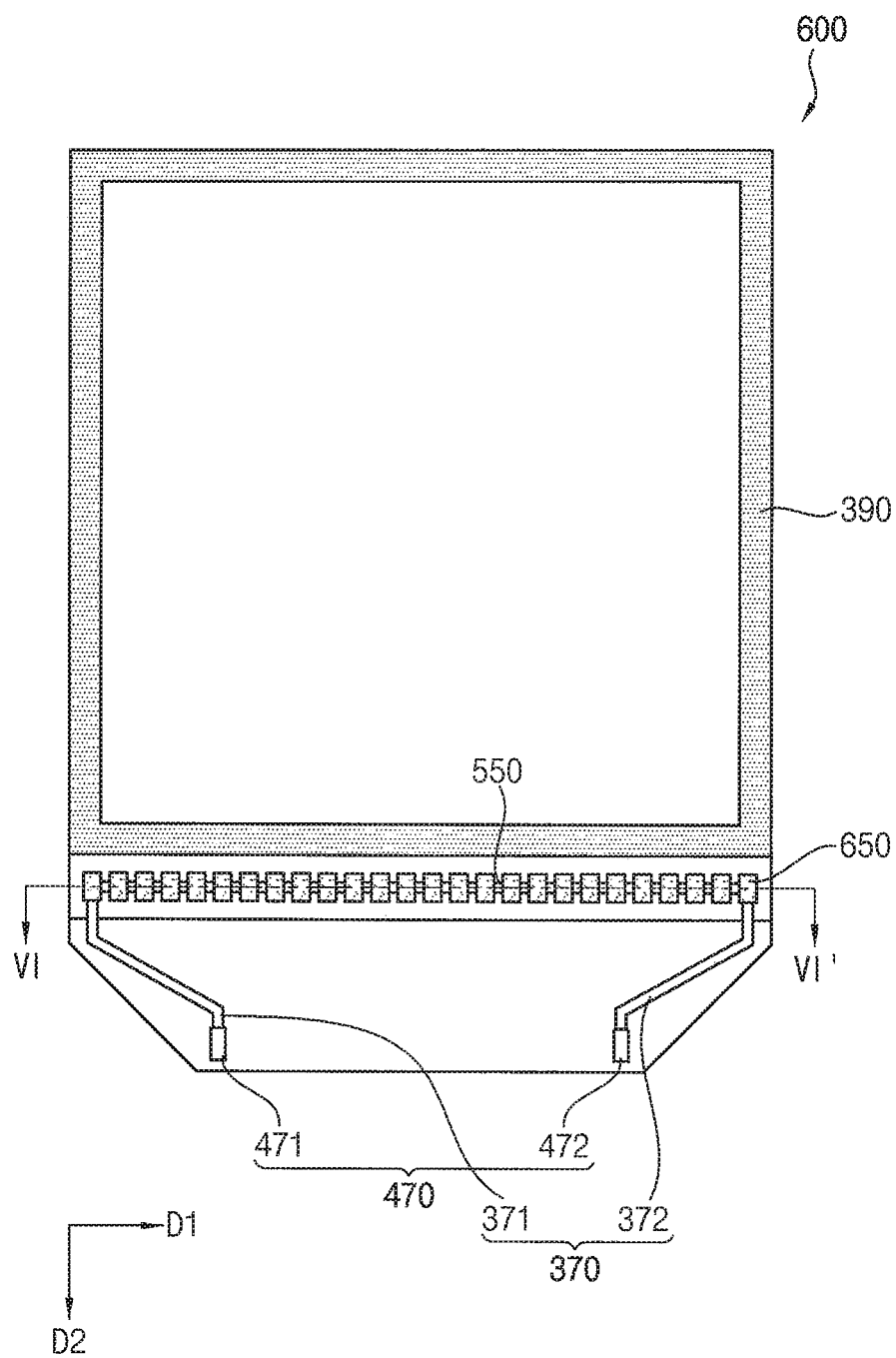
FIG. 11 is a plan view illustrating elements of an OLED device in accordance with embodiments.
Figure 12:
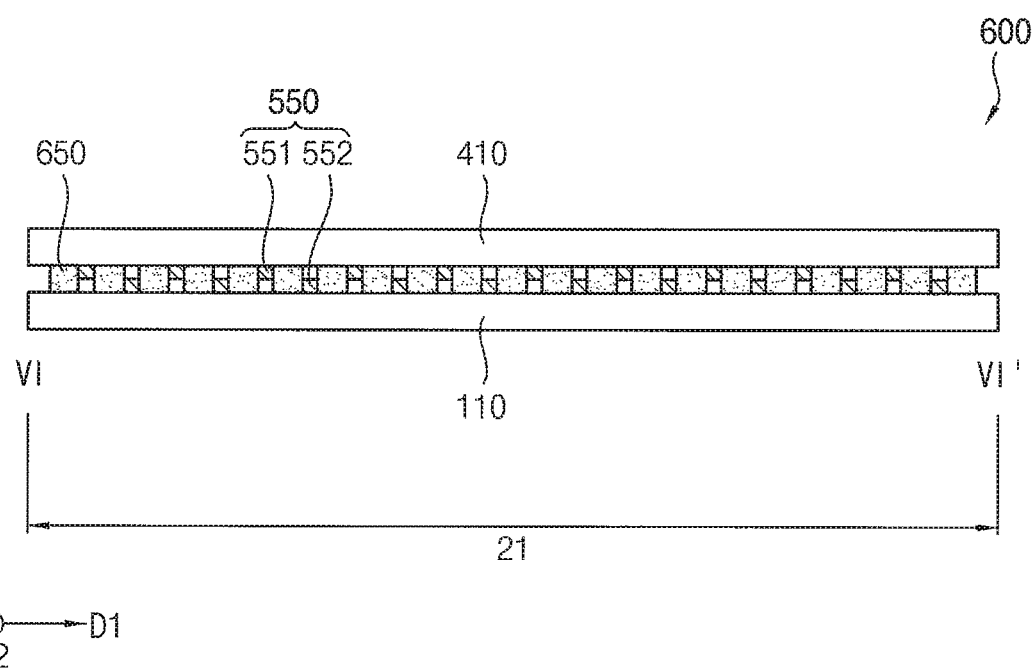
FIG. 12 is a cross-sectional view taken along a line VI-VI' of FIG. 11 in accordance with embodiments.

FIG. 11 is a plan view illustrating elements of an OLED device 600 in accordance with example embodiments, and FIG. 12 is a cross-sectional view taken along a line VI-VI' of FIG. 11 in accordance with example embodiments. The OLED device 600 may have elements substantially the same as or similar to elements described with reference to one or more of FIGS. 1 through 10 except for a seal pattern 650 and a connection electrode 550. Detailed descriptions for elements that are substantially the same as or similar to elements described with reference to one or more of FIGS. 1 through 10 may not be repeated.

Referring FIGS. 11 and 12, the OLED device 600 may include a lower substrate 110, a semiconductor element 250, a planarization layer 270, a light emitting structure 200, a seal member 390, a seal pattern 650, a connection wire 370, a connection electrode 550, a pad electrode 470, an upper substrate 410, etc. The connection wire 370 may include a first connection wire 371 and a second connection wire 372, and the pad electrode 470 may include a first pad electrode 471 and a second pad electrode 472. The connection electrode 550 may include upper connection electrodes 551 and lower connection electrodes 552.

The seal pattern 650 may be disposed in the first peripheral region 21 on the insulating interlayer 190 and may be spaced apart from the seal member 390 in the second direction D2. The seal pattern 650 may include a plurality of seal patterns, and the seal patterns may be arranged along the first direction D1, and may be spaced apart from each other.

The seal patterns may be in direct contact with an upper surface of the insulating interlayer 190, a lower surface of the upper substrate 410, and the connection electrode 550. A portion of the connection electrode 550 may overlap one or more of the seal patterns. In example embodiments, the seal pattern 650 may include one or more conductive materials. The seal pattern 650 electrically connects the connection wire 370 and the connection electrode 550. The seal pattern 650 may include frit including a conductive material.

The upper connection electrodes 551 and the lower connection electrodes 552 may be disposed between the seal patterns. The upper connection electrodes 551 may be disposed on a lower surface of the upper substrate 410, and the lower connection electrodes 552 may be disposed on the lower substrate 110. The upper connection electrodes 551 and the lower connection electrodes 552 may be alternately arranged in the first direction D1. Each of the upper connection electrodes 551 may be disposed between and directly contact two immediately adjacent first-set seal patterns among the seal patterns. Each of the lower connection electrodes 552 may be disposed between and directly contact two immediately adjacent second-set seal patterns among the seal patterns. The connection electrode 550 may include at least one of a metal, an alloy of a metal, metal nitride, conductive metal oxide, transparent conductive materials, etc. Some of these materials may be used alone or in suitable combination. The connection electrode 550 may have a multi-layered structure including a plurality of the layers.

The seal pattern 650 may include first through (N)th seal patterns, where N is an integer more than 1; the first through (N)th seal patterns may be spaced apart from each other. The connection electrode 550 may include a plurality of connection electrodes. The connection electrodes may be disposed in respective spaces between the first through (N)th seal patterns and may electrically connect the first through (N)th seal patterns. An upper connection electrode 551 may be disposed between (K)th and (K+1)th seal patterns among the first through (N)th seal patterns; a lower connection electrode 552 may be disposed between (K+1)th and (K+2)th seal patterns among the first through (N)th seal patterns, where K is an integer between 1 and N. The upper connection electrodes 551 may be disposed on a lower surface of the upper substrate 410, and the lower connection electrodes 552 may be disposed on the lower substrate 110.

Embodiments may be applied to various display devices including an organic light emitting diode display device. Embodiments may be applied to vehicle-display device, a ship-display device, an aircraft-display device, portable communication devices, display devices for display or for information transfer, a medical-display device, etc.

The foregoing is illustrative of example embodiments and is not to be construed as limiting. Although a few example embodiments have been described, many modifications are possible in the example embodiments. All such modifications are within the scope defined in the claims.

What is claimed is:

1. A display device comprising:
a first substrate;
a second substrate overlapping the first substrate;
a light emitting structure positioned between the first substrate and the second substrate;
a seal member positioned between the first substrate and the second substrate;
a seal structure spaced from the seal member, wherein a first section of the seal member is positioned between the light emitting structure and the seal structure;
a first pad electrode, wherein the seal structure is positioned between the seal member and the first pad electrode; and
a first connection wire electrically connecting the seal structure and the first pad electrode.

2. The display device of claim 1, wherein the first section of the seal member is directly connected to a second section of the seal member and is positioned between the second section of the seal member and the seal structure, and wherein a lengthwise direction of the first section of the seal member is different from a lengthwise direction of the second section of the seal member.

3. The display device of claim 1, wherein the seal structure is shorter than the first section of the seal member in a lengthwise direction of the first section of the seal member.

4. The display device of claim 1, wherein the seal structure is spaced from the seal member in a direction that is perpendicular to a lengthwise direction of the first section of the seal member.

5. The display device of claim 1, wherein the seal structure includes:
 a first seal part corresponding to a first end of the first section of the seal member; and
 a second seal part spaced from the first seal part and corresponding to a second end of the first section of the seal member.

6. The display device of claim 5, further comprising:
 a connection electrode disposed between the first seal part and the second seal part, extending parallel to the first section of the seal member, and electrically connecting the first seal part and the second seal part.

7. The display device of claim 1, wherein the seal structure includes seal parts that are spaced from each other.

8. The display device of claim 7, further comprising:
 first-set connection electrodes disposed between first-set immediately neighboring ones of the seal parts and electrically connecting the first-set immediately neighboring ones of the seal parts.

9. The display device of claim 8, further comprising:
 second-set connection electrodes disposed closer to the first substrate than the first-set connection electrodes, disposed between second-set immediately neighboring ones of the seal parts, and electrically connecting the second-set immediately neighboring ones of the seal parts.

10. The display device of claim 9, wherein the first-set connection electrodes are disposed directly on the second substrate, and wherein the second-set connection electrodes are disposed directly on the first substrate.

11. The display device of claim 1, wherein a sum of a width of the first section of the seal member and a width of the seal structure in a width direction of the first section of the seal member is greater than a width of a second section of the seal member in a direction perpendicular to the width direction of the first section of the seal member.

12. The display device of claim 1, wherein the first pad electrode is positioned closer to a first edge of the first substrate than to a second edge of the first substrate, and wherein the first edge of the first substrate is parallel to the second edge of the first substrate and is shorter than the second edge of the first substrate.

13. The display device of claim 1, wherein an edge of the second substrate is positioned between the seal structure and the first pad electrode.

14. The display device of claim 1, wherein the seal structure includes at least one conductive material.

15. The display device of claim 1, further comprising:
 a second pad electrode, wherein the seal structure is positioned between the seal member and the second pad electrode; and
 a second connection wire electrically connecting the seal structure and the second pad electrode, wherein the first connection wire and the second connection wire are respectively directly connected to two opposite ends of the seal structure.

16. The display device of claim 15, wherein a length of the seal structure is greater than a distance between first pad electrode and the second pad electrode.

17. The display device of claim 1, wherein the seal member surrounds the light emitting structure in a plan view of the display device, and wherein the seal structure has a bar shape in the plan view of the display device.

18. The display device of claim 1, wherein each of the seal member and the seal structure directly contacts the second substrate.

19. The display device of claim 1, further comprising:
 a semiconductor layer overlapping the first substrate;
 a gate electrode overlapping the semiconductor layer;
 a gate insulation layer electrically insulating the gate electrode from the semiconductor layer;
 a drain electrode electrically connected to the semiconductor layer and electrically connected to the light emitting structure; and
 an insulating interlayer electrically insulating the drain electrode from the gate electrode,
 wherein the gate insulation layer and the insulating interlayer are disposed between the seal member and the first substrate.

20. The display device of claim 19, wherein the gate insulation layer and the insulating interlayer are disposed between the seal structure and the first substrate.

* * * * *